(12) United States Patent
Doany et al.

(10) Patent No.: US 8,674,766 B2
(45) Date of Patent: Mar. 18, 2014

(54) DIFFERENTIAL AMPLIFIER STAGE WITH INTEGRATED OFFSET CANCELLATION CIRCUIT

(71) Applicant: International Business Machines Corporation, Armonk, NY (US)

(72) Inventors: Fuad E. Doany, Katonah, NY (US); Alexander V. Rylyakov, Mount Kisco, NY (US); Clint L. Schow, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/911,773

(22) Filed: Jun. 6, 2013

(65) Prior Publication Data

US 2013/0271217 A1    Oct. 17, 2013

Related U.S. Application Data

(63) Continuation of application No. 12/826,831, filed on Jun. 30, 2010, now Pat. No. 8,482,352.

(51) Int. Cl.
*H03F 3/45*    (2006.01)
(52) U.S. Cl.
USPC ............................................... 330/259; 330/9

(58) Field of Classification Search
USPC ............................. 330/9, 253, 259; 327/307
See application file for complete search history.

(56) References Cited

U.S. PATENT DOCUMENTS

| | | | |
|---|---|---|---|
| 6,087,897 | A | 7/2000 | Wang |
| 6,657,488 | B1 | 12/2003 | King et al. |
| 6,756,842 | B2 | 6/2004 | Mehr et al. |
| 6,756,924 | B2 | 6/2004 | Lee et al. |
| 7,088,174 | B2 | 8/2006 | Glass |
| 7,321,259 | B1 | 1/2008 | Shumarayev |
| 7,355,471 | B2 | 4/2008 | Chen et al. |
| 7,560,969 | B2 | 7/2009 | Chu |
| 2008/0030266 | A1 | 2/2008 | Liu et al. |
| 2008/0238547 | A1* | 10/2008 | Matsuoka ................. 330/259 |
| 2009/0302923 | A1* | 12/2009 | Smeloy et al. .............. 330/9 |

* cited by examiner

*Primary Examiner* — Khanh V Nguyen
(74) *Attorney, Agent, or Firm* — Tutunjian & Bitetto, P.C.; Anne Dougherty

(57) ABSTRACT

A differential amplifier stage and method for offset cancellation include an amplifier having an input and an output. An internal offset cancellation circuit has an input for receiving a control signal to control offset cancellation in the amplifier. The offset cancellation circuit is integrated with the amplifier but isolated from the input and the output of the amplifier, and, in accordance with its isolation, an impedance of the stage is unaffected by the offset cancellation circuit.

12 Claims, 3 Drawing Sheets

DIFFERENTIAL AMPLIFIER STAGE WITH INTEGRATED OFFSET CANCELLATION CIRCUIT

CROSS-REFERENCE TO RELATED APPLICATIONS

This application is a Continuation application of allowed co-pending U.S. patent application Ser. No. 12/826,831 filed on Jun. 30, 2010, incorporated herein by reference in its entirety.

GOVERNMENT RIGHTS

This invention was made with Government support under Contract No.: MDA972-03-3-0004 awarded by the Defense Advanced Research Projects Agency (DARPA). The Government has certain rights in this invention.

BACKGROUND

1. Technical Field

The present invention relates to differential amplifiers and more particularly to an offset cancellation circuit which is isolated from an amplifier input and output so as not to affect impedance and loading of control loops.

2. Description of the Related Art

For high-gain differential amplifiers fabricated in integrated circuit technologies, an offset-cancellation (OC) circuit must be employed to ensure proper operation. High-gain amplifiers are typically constructed by connecting a chain of individual differential amplifier stages. The function of the OC circuit is to correct for the overall difference in gain experienced by the differential signals being amplified such that both differential signals experience a same overall gain through the amplifier chain.

Without an OC circuit, inevitable transistor-level device variations result in a small imbalance in input stages being converted to a large output offset through the high gain of the amplifier chain. The large output offset saturates the final amplifier stages, extinguishing their gain and drastically reducing the overall sensitivity of the amplifier. An OC circuit provides a method of equalizing the gain in the two differential paths to eliminate this effect.

In a typical OC implementation, the differential output signals of a high-gain amplifier are sampled and the gain or operating point of one of the first amplifier stages is adjusted to equalize the outputs. In a typical feedback implementation, an OC control loop samples and feeds back average voltages of the limiting amplifier's differential outputs to an early stage whose operating point is adjusted to minimize the difference between the average voltages of the differential outputs. In conventional implementations, an RC network with a relatively large time constant (relative to the operating data rate of the amplifier) is used to extract the DC, or average, values of the amplifier outputs. An active element in the OC loop may be included to appropriately condition the feedback signals, and the OC loop is closed by applying the feedback signals at the input of one of the early amplifier stages.

Optical receivers include functional OC control loops that must be carefully designed. In particular, at the point where feedback is applied, a loading on a preceding and a following amplifier stage must be minimized so that the stages function properly. Conventional approaches to closed loop offset cancellation include a feedback applied at an amplifier input or a feedback applied at an output of a first amplifier stage. In both cases, the feedback loop includes a resistance $R_{OC}$ and a capacitance $C_{OC}$ such that only the average or DC value of the output voltages is sampled.

SUMMARY

A differential amplifier stage and method for offset cancellation include an amplifier having an input and an output. An internal offset cancellation circuit has an input for receiving a control signal to control offset cancellation in the amplifier. An interface device is configured to generate the control signal for the internal offset cancellation circuit. The offset cancellation circuit is integrated with the amplifier but isolated from the input and the output of the amplifier, and, in accordance with its isolation, an impedance of the stage is unaffected by the offset cancellation circuit.

A multi-stage amplifier includes a transimpedance amplifier (TIA) coupled to an input. A Cherry-Hooper stage is coupled to the TIA, and the Cherry-Hooper stage has an amplifier including an input and an output. An internal offset cancellation circuit includes an input for receiving a control signal to control offset cancellation in the amplifier. The offset cancellation circuit is integrated with the amplifier but isolated from the input and the outputs of the amplifier and, in accordance with its isolation, has an impedance of the stage that is unaffected by the offset cancellation circuit. A plurality of amplifier stages coupled to the Cherry-Hooper stage.

A method for offset cancellation includes inputting a differential signal to an amplifier stage, generating a control signal for an internal offset cancellation circuit using an interface device, canceling an offset in the differential signal using control information provided to an internal offset cancellation circuit which is integrally formed in the amplifier stage, and isolating the offset cancellation circuit from an input and an output of the amplifier circuit of the amplifier stage such that an impedance of the amplifier stage is unaffected by the offset cancellation circuit.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
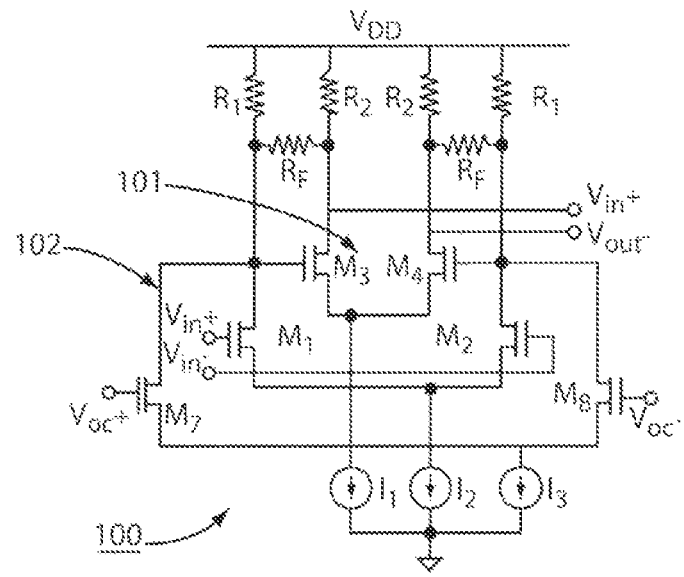
FIG. 1 is a schematic diagram showing an amplifier stage having an integrated and isolated offset cancellation circuit in accordance with one illustrative embodiment.

In accordance with the present principles, an amplifier stage is provided with a topology associated with high-speed, low power differential gain stages that incorporates an internal offset cancellation (OC) circuit that eliminates loading on adjacent stages. A differential gain stage may be based on a Cherry-Hooper topology with an integrated offset cancellation (OC) circuit. By incorporating the OC circuit within the stage, preceding and following stages are unaffected by loading of an OC control loop. Advantageously, this permits the surrounding stages to be optimized without the additional constraint of OC loop loading, which results in the elimination of buffer circuits that adversely affect both noise performance and power consumption. Offset cancellation is needed for array applications where many amplifiers have to operate uniformly. A primary example of this type of application is in a dense parallel optical transceiver.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc. or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture having a semiconductor substrate; however, other architectures, structures, substrate materials and process features and steps may be varied within the scope of the present invention. A circuit as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to optical transceivers and advanced computer products having a display, a keyboard or other input device, and a central processor.

Referring now to the drawings in which like numerals represent the same or similar elements and initially to FIG. 1, an amplifier stage 100 based on, e.g., a modified Cherry-Hooper amplifier implementation is illustratively shown in accordance with one embodiment. Amplifier stage 100 preferably includes a high-gain differential amplifier. 101. Amplifier stage 100 includes a differential input $V_{in}$ connected to gates of transistors $M_1$ and $M_2$. When an input of the proper polarity is received, $M_1$ and $M_2$ are enabled to permit stage 100 to amplify the input signal. Amplifier stage 100 includes a supply voltage $V_{DD}$ coupled to resistances $R_1$ and $R_2$ which are located on paths which are connected by a resistance $R_F$. $R_F$ maintains a voltage differential between the $R_1$ and $R_2$ paths. $R_1$ resistors connect to gates of transistors $M_3$ and $M_4$, and $R_2$ connects to a source of the transistors $M_3$ and $M_4$. Transistors $M_3$ and $M_4$ perform the amplifying function and provide a differential $V_{out}$ output. An internal offset cancellation circuit 102 includes transistors $M_7$ and $M_8$ and a bias current $I_3$, which joins with bias currents $I_1$ and $I_2$ of the other transistor pairs.

Offset cancellation circuit 102 is isolated from the inputs ($V_{in}$) and outputs ($V_{out}$) of the stage 100. Due to its isolation, the offset cancellation circuit 102 does not affect the input or output impedance of the stage 100. The offset cancellation circuit 102 is not affected or loaded by the output impedance of a previous amplifier stage or the input impedance of a following amplifier stage when employed in an amplifier chain. An active offset cancellation circuit 102 adjusts DC voltages of the differential outputs ($V_{out}$) of the stage 100 based upon a DC voltage applied at the inputs ($V_{oc}$) of the offset cancellation circuit 102. The DC offsets are typical and unavoidable in semiconductor circuits due to layout and processing variations.

Figure 2:
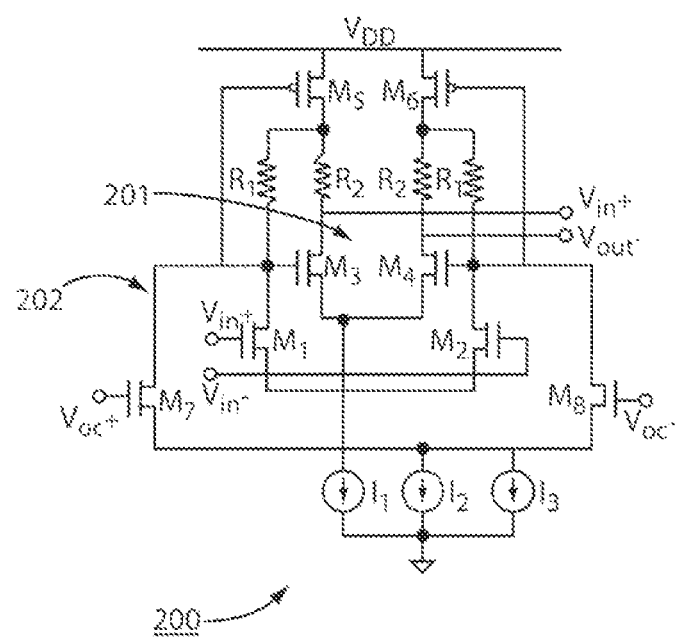
FIG. 2 is a schematic diagram showing an amplifier stage having an integrated and isolated offset cancellation circuit in accordance with another illustrative embodiment.

Referring to FIG. 2, a stage 200 includes a variation of the amplifier stage 100 based on, e.g., a modified Cherry-Hooper amplifier implementation. Amplifier stage 200 also preferably includes a high-gain differential amplifier 201. Amplifier stage 200 includes a differential input $V_{in}$ connected to gates of transistors $M_1$ and $M_2$. When an input of the proper polarity is received, $M_1$ and $M_2$ are enabled to permit stage 200 to amplify the input signal. Amplifier stage 200 includes a supply voltage $V_{DD}$ coupled to paths with resistances $R_1$ and $R_2$. Transistors $M_5$ and $M_6$ connect the resistances $R_1$ and $R_2$ to the supply voltage in accordance with differential inputs $V_{oc}$ of the offset cancellation circuit 202.

Offset cancellation circuit 202 is similarly isolated from the inputs ($V_{in}$) and outputs ($V_{out}$) of the stage 200. Due to its isolation, the offset cancellation circuit 202 does not affect the input or output impedance of the stage 200. The offset cancellation circuit 202 is not affected or loaded by the output impedance of a previous amplifier stage or the input impedance of a following amplifier stage when employed in an amplifier chain. Also the active offset cancellation circuit 202 adjusts DC voltages of the differential outputs ($V_{out}$) of the stage 200 based upon a DC voltage applied at the inputs (Voc) of the offset cancellation circuit 202.

It should be understood that the integrated OC circuits illustratively shown in stages 100 and 200 may include other isolation circuits, components and configurations. These may include other active or passive elements.

Figure 3:
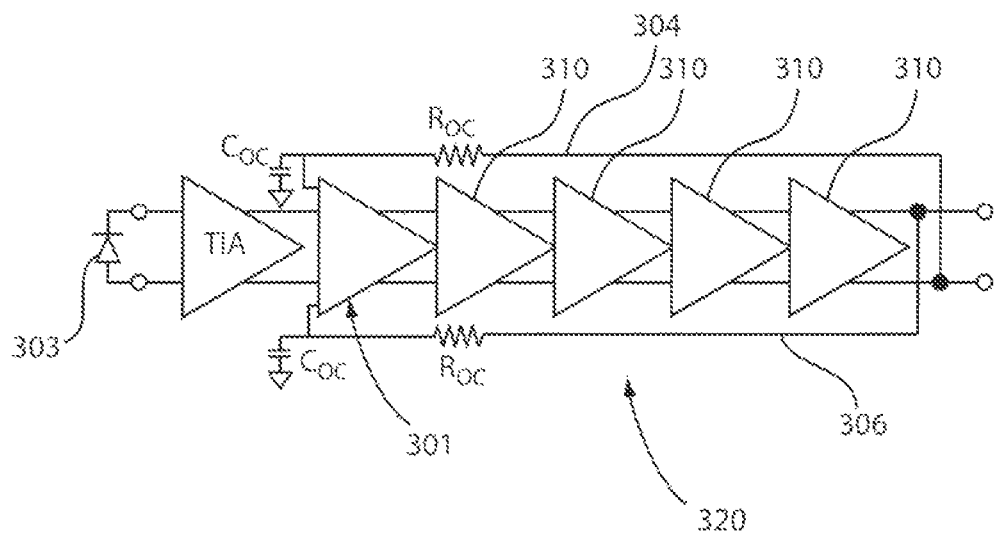
FIG. 3 is a schematic diagram showing a closed loop multi-stage amplifier having a Cherry Hopper Stage, which includes an integrated and isolated offset cancellation circuit in accordance with one illustrative embodiment.

Referring to FIG. 3, a high-gain optical receiver 300 is illustratively shown utilizing, e.g., a Cherry-Hooper gain stage (100, 200) with integrated offset cancellation to eliminate loading due to a transimpedance amplifier (TIA) output impedance. Receiver 300 is one particularly attractive application (e.g., an optical receiver circuit) in accordance with the present principles. The transimpedance amplifier (TIA) may receive a differential input signal from a photodiode 303 or other device. TIA can be directly followed by a Cherry-Hooper amplifier stage 301 with an integrated OC. Stage 301 may include e.g., stage 100 or 200. This permits offset correction to be applied immediately after the TIA with no restrictions on the output impedance of the TIA imposed by OC loop(s) 304 and 306. Contrast this with applying offset correction directly to the TIA outputs, which is often not feasible due to low output impedance of certain TIA designs.

In conventional circumstances, the low TIA output impedance shunts the RC network in the OC loop and prevents the loop from functioning properly. To enable proper operation of the OC loop in a conventional device, a buffer typically must be inserted between the TIA and a first amplifier stage. The added buffer not only contributes additional power consumption, but also adds noise that degrades sensitivity and sensitivity is one of the primary receiver performance metrics.

By employing the integrated offset cancellation circuits 102 and 202 in stages 100 and 200, respectively, in accordance with the present principles, the TIA output impedance does not load the OC loop (304, 306), allowing the receiver to function properly without an added buffer. The loops 304 and 306 are feedback loops that include a resistance $R_{OC}$ and a capacitance $C_{OC}$.

Although the example given is for an optical receiver (300), the present embodiments may include any application where high-gain and sensitivity are needed. In addition, although the configuration of FIG. 3 illustrates closed-loop control, the integrated OC circuit (102, 202) is also suitable for open-loop operation where an initial calibration is applied, and may be periodically updated, to set the operating point of the OC circuit.

Figure 4:
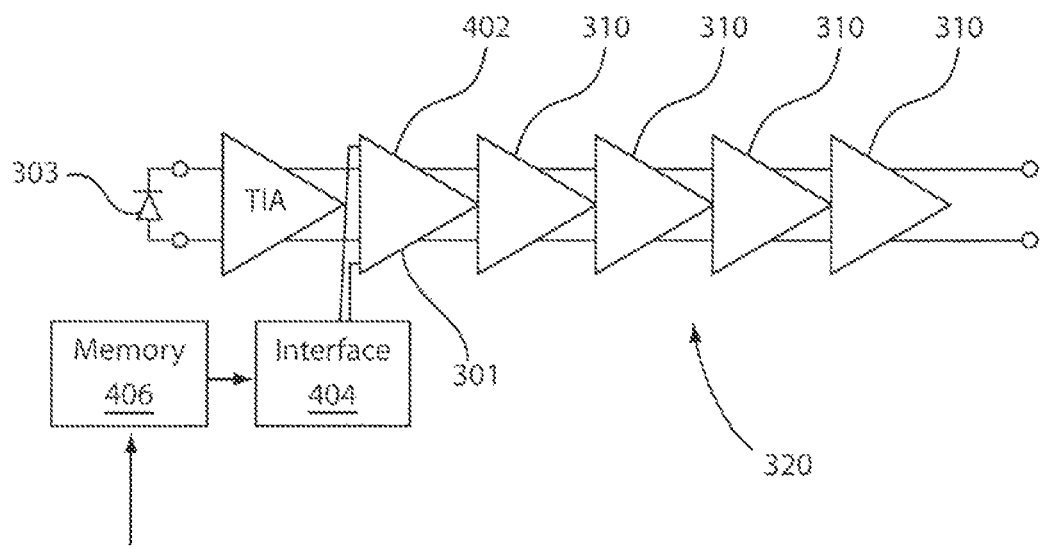
FIG. 4 is a schematic diagram showing an open loop multi-stage amplifier having a Cherry Hopper Stage, which includes an integrated and isolated offset cancellation circuit and an interface unit for generating control signals in accordance with one illustrative embodiment.

Referring to FIG. 4, an amplifier stage 402 for a multi-stage amplifier receiver 400 is illustratively shown using an open-loop mode of operation. An integrated OC circuit (102, 202) can be biased at an optimal point using a digital interface 404 to a chip including the stage 400. In array applications with many individual channels, each channel can be calibrated through the digital interface 404, and a calibration routine could be an automated method run by the interface 404 or other device. The appropriate calibration settings for each channel could also be stored in a memory bank 406 and periodically updated to provide long-term offset cancellation that compensates for device aging or slowly-varying thermal effects. Tracking the calibration coefficients as a function of time may also provide information on the aging of the amplifier circuit 400 as a means of eventual failure prediction.

As shown in FIGS. 3 and 4, an amplifier chain 320 includes a plurality of amplifiers 310. In FIG. 3, an amplifier stage 301 with an offset cancellation circuit (102, 202) is formed or inserted into the high-gain differential amplifier chain 320, which includes multiple amplification stages 310. The offset cancellation circuit 102, 202 is used to remove offsets between the DC voltages of the overall amplifier chain outputs.

In the configuration of FIG. 3, the differential outputs of an amplifier stage 310 are low-pass filtered and applied to the inputs of the offset cancellation circuit 102, 202 to cancel the DC offset between the differential outputs. An amplifier stage 310 is used to provide the feedback signals to the offset cancellation circuit 301. In one embodiment, the amplifier stage that is used to provide the feedback signals is stage 301 (i.e., the stage that includes the offset cancellation circuit). In another embodiment, the amplifier stage (310) used to provide the feedback signals to the offset cancellation circuit (102, 202) in stage 301 can be any stage in the amplifier chain 320 that follows the stage (e.g., 301) that has the offset cancellation circuit (102, 202).

The offset cancellation amplifier may be included in a main amplifier stage in an optical receiver, and may be any amplifier stage using the open mode as shown in FIG. 4. The circuits as depicted in FIGS. 1, 2, 3 and 4 may be implemented in Complementary Metal Oxide Semiconductor (CMOS) technology, implemented in bipolar transistor technology (i.e., SiGe BiCMOS), implemented in III-V semiconductor technology, such as GaAs or InP, or any other semiconductor technology.

Figure 5:
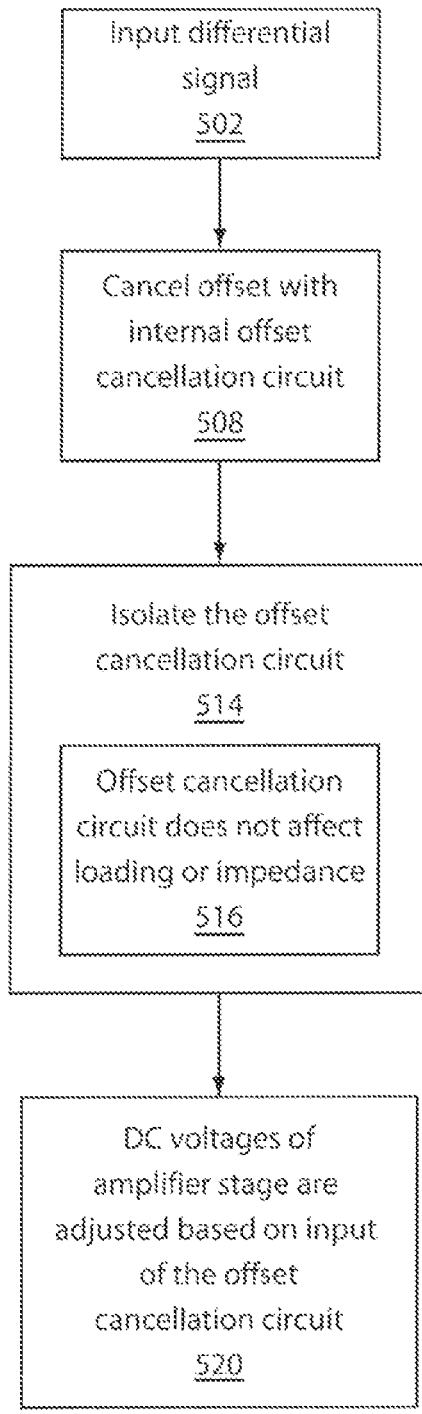
FIG. 5 is a block/flow diagram showing a system/method for offset cancellation in accordance with one illustrative embodiment.

Referring to FIG. 5, a block/flow diagram shows a system/method for offset cancellation in accordance with one illustrative embodiment. In block 502, a differential signal is input to an amplifier stage. In block 508, an offset in the differential signal is cancelled using a control signal provided to an internal offset cancellation circuit which is integrally formed in the amplifier stage. The control signal may include a feedback signal from an offset cancellation feedback loop configured to feed back a downstream amplifier output to the offset cancellation circuit. Alternately, the amplifier stage includes open-mode operation and the control signal is generated for the offset cancellation circuit using an interface device.

In block 514, the offset cancellation circuit is isolated from an input and an output of the amplifier circuit of the amplifier stage such that an impedance of the amplifier stage is unaffected by the offset cancellation circuit. The isolation is electrical isolation so that the amplifier inputs/outputs and any control loops (feedback loops) remain unloaded by the offset cancellation device. In block 516, the isolating includes isolating the offset cancellation circuit such that an output impedance of a previous amplifier stage and an input impedance of a following amplifier stage are unloaded by the offset cancellation circuit.

In block 520, direct current (DC) voltages of the output of the amplifier stage may be adjusted based upon a DC voltage applied at the inputs of the offset cancellation circuit.

Having described preferred embodiments of a differential amplifier stage with integrated offset cancellation circuit and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A differential amplifier stage, comprising
an amplifier having an input and an output;
an internal offset cancellation circuit having an input for receiving a control signal to control offset cancellation in the amplifier; and
an interface device configured to generate the control signal for the internal offset cancellation circuit;
the internal offset cancellation circuit being integrated with the amplifier but isolated from the input and the output of the amplifier and, in accordance with its isolation, an impedance of the differential amplifier stage is unaffected by the internal offset cancellation circuit.

2. The differential amplifier stage as recited in claim 1, wherein the differential amplifier stage is included in a multi-stage amplifier and, due to its isolation, the internal offset cancellation circuit is not loaded by an output impedance of a previous amplifier stage and an input impedance of a following amplifier stage.

3. The differential amplifier stage as recited in claim 1, wherein the internal offset cancellation circuit adjusts direct current (DC) voltages of the output of the differential amplifier stage based upon a DC voltage applied at the inputs of the internal offset cancellation circuit.

4. The differential amplifier stage as recited in claim 1, wherein the differential amplifier stage is included in a multi-stage amplifier and further comprises an offset cancellation feedback loop configured to feed back a downstream amplifier output to the internal offset cancellation circuit.

5. The differential amplifier stage as recited in claim 1, wherein the differential amplifier stage includes open-mode operation.

6. The differential amplifier stage as recited in claim 5, wherein the interface device generates the control signal based on at least one of a function of time and a function of temperature.

7. The differential amplifier stage as recited in claim 1, wherein the differential amplifier stage is integrated in a semiconductor chip.

8. A method for offset cancellation, comprising:
inputting a differential signal to an amplifier stage;
generating a control signal for an internal offset cancellation circuit using an interface device;

canceling an offset in the differential signal using the control signal provided to the internal offset cancellation circuit which is integrally formed in the amplifier stage; and isolating the offset cancellation circuit from an input and an output of the amplifier circuit of the amplifier stage such that an impedance of the amplifier stage is unaffected by the offset cancellation circuit.

9. The method as recited in claim 8, wherein isolating includes isolating the offset cancellation circuit such that an output impedance of a previous amplifier stage and an input impedance of a following amplifier stage are not loaded by the offset cancellation circuit.

10. The method as recited in claim 8, further comprising adjusting direct current (DC) voltages of the output of the amplifier stage based upon a DC voltage applied at the inputs of the offset cancellation circuit.

11. The method as recited in claim 8, wherein the control signal is received by an offset cancellation feedback loop configured to feed back a downstream amplifier output to the offset cancellation circuit.

12. The method as recited in claim 8, wherein the amplifier stage includes open-mode operation and the method further includes generating the control signal for the offset cancellation circuit using an interface device.

* * * * *